(12) United States Patent
Jang et al.

(10) Patent No.: US 7,446,617 B2
(45) Date of Patent: Nov. 4, 2008

(54) LOW POWER CONSUMPTION FREQUENCY DIVIDER CIRCUIT

(75) Inventors: Sheng Lyang Jang, Taipei (TW); Yun Hsueh Chuang, Taipei (TW)

(73) Assignee: National Taiwan University of Science & Technology, Taipei (TW)

( * ) Notice: Subject to any disclaimer, the term of this patent is extended or adjusted under 35 U.S.C. 154(b) by 152 days.

(21) Appl. No.: 11/606,071

(22) Filed: Nov. 30, 2006

(65) Prior Publication Data

US 2008/0129399 A1 Jun. 5, 2008

(51) Int. Cl.
*H03B 5/12* (2006.01)
*H03L 7/24* (2006.01)
(52) U.S. Cl. .................. 331/55; 331/117 FE; 331/172; 331/177 V

(58) Field of Classification Search ............. 331/50–52, 331/117 R, 117 FE, 117 D, 167–168, 172–173, 331/177 V
See application file for complete search history.

(56) References Cited

U.S. PATENT DOCUMENTS

2008/0074199 A1* 3/2008 Jang et al. ................. 331/16

* cited by examiner

*Primary Examiner*—David Mis
(74) *Attorney, Agent, or Firm*—Birch, Stewart, Kolasch & Birch, LLP

(57) ABSTRACT

The present invention discloses a low power consumption frequency divider circuit. It mainly comprises a signal source; a signal injection circuit; and an oscillator circuit. The low-power consumption frequency divider circuit according to the present invention mainly uses the configuration of current reused circuit to form the common current path for reducing the power loss in the disclosed frequency divider circuit.

6 Claims, 6 Drawing Sheets

LOW POWER CONSUMPTION FREQUENCY DIVIDER CIRCUIT

BACKGROUND OF THE INVENTION

1. Field of the Invention

The present invention generally relates to a divider, and more particularly to a low power consumption frequency divider circuit using the configuration of current reused circuit to form the common current path.

2. Description of the Related Art

In communication system, the local oscillator is used to provide a mixing signal for up-converting a low frequency modulated signal or down-converting a radio frequency (RF) signal to be modulated. Thus, most power consumption appears in the local oscillator. To avoid un-effective power consumption, low power and full integrated frequency divider is required.

The frequency divider is widely used in the wire or wireless communication. There are several types of RF frequency divider, comprising (1) type of common mode logic, CML; (2) type of static logic; (3) type of dynamic logic; (4) type of miller divider and (5) type of injection locking frequency divider. Each one has its advantages and disadvantages. For examples, types of the common mode logic and miller divider can operate at very high frequency but have disadvantage of high power consumption. Type of dynamic logic has advantage of very low power consumption but operate at low frequency. By considering the power consumption and working frequency, type of the injection locking frequency divider is a preferred choice.

Currently, the injection locking frequency divider uses inductor-capacitor (LC) tank resonator to be the basic oscillator, to realize the injection locking frequency divider. The injection locking frequency divider using the LC tank resonator can be further divided into (1) direct injection locking frequency divider and (2) harmonic injection locking frequency divider. Direct injection locking frequency divider provides an oscillating signal to a LC tank resonant oscillator through a switch. The structure of the oscillator is a conventional differential LC tank inter-coupled oscillator. However, the differential LC tank inter-coupled oscillator use two current paths, thus causing much power consumption of the circuit. Prior art can be found in U.S. Pat. No. 4,806,872 issued to Cowley al., entitled "Frequency modulation receiver employing frequency divider". It discloses the frequency modulation receiver using injection locking frequency divide. The disclosed oscillator uses many current paths, thus causing much power consumption of the circuit.

To overcome the aforementioned problems, there is needed to provide a novel frequency divider. Thus, in the present invention, a novel low-power consumption frequency divider circuit using the configuration of current reused circuit to form the common current path for reducing the power loss is disclosed.

SUMMARY OF THE INVENTION

It is an objective of the present invention to provide a low power consumption frequency divider circuit, mainly using the configuration of current reused circuit to form the common current path for reducing the power loss in the disclosed frequency divider circuit.

To achieve the above objectives, the present invention provides a low power consumption frequency divider circuit. It mainly comprises a signal source; a signal injection circuit; and an oscillator circuit. The signal source is used to provide a RF signal; the signal injection circuit is electrically connected to the signal source and is used to receive and amplify the RF signal from the signal source; and the oscillator circuit is constructed from a plurality of LC tank resonant circuits and electrically connected to the signal injection circuit. The oscillator circuit is used to receive the RF signal from the signal injection circuit and provide a oscillating signal with a frequency around the 50% of the frequency of the RF signal. The inductance and capacitance of the plurality of LC tank resonant circuits determine the injection locking range of the frequency divider circuit.

According to one aspect of the low power consumption frequency divider circuit, the signal injection circuit comprises a plurality of resistors; a plurality of capacitors; and a transistor, electrically connected to the plurality of resistors and the plurality of capacitors, used to receive and amplify the RF signal from the signal source.

According to another aspect of the low power consumption frequency divider circuit, the plurality of LC tank resonant circuits has a plurality of N type metal-oxide-semiconductor field effect transistor (N-MOSFET) to generate a negative resistance effect to oscillate the oscillator circuit continuously.

According to another aspect of the low power consumption frequency divider circuit, the signal injection circuit has at least one N type metal-oxide-semiconductor field effect transistor (N-MOSFET) and the oscillator circuit has at least one N type metal-oxide-semiconductor field effect transistor (N-MOSFET).

According to another aspect of the low power consumption frequency divider circuit, the oscillator circuit is selected from one of the group including inter-coupled oscillator, Armstrong oscillator and colpitts oscillator.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE PREFERRED EMBODIMENT

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 1:
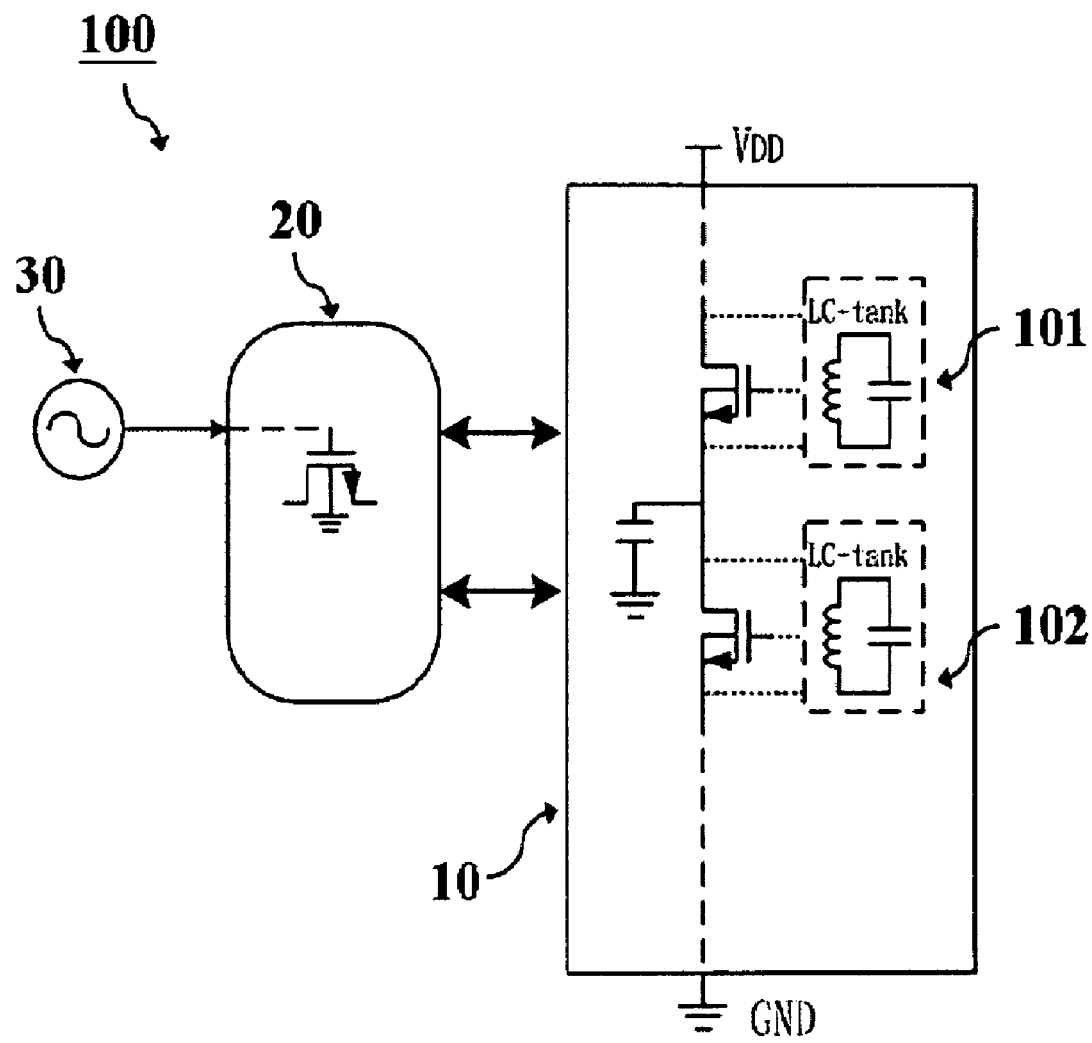
FIG. 1 shows a schematic of the low-power consumption frequency divider circuit according to the present invention.

The main objective of the present invention is to provide a low power consumption frequency divider circuit, mainly using the configuration of current reused circuit to form the common current path for reducing the power loss in the disclosed frequency divider circuit. Referring to the FIG. 1, it is a schematic of the low-power consumption frequency divider circuit according to the present invention. The low-power consumption frequency divider circuit 100 mainly comprises a signal source 30; a signal injection circuit 20; and an oscillator circuit 10. The signal source 30 is used to provide a RF signal; the signal injection circuit 20 is electrically connected to the signal source 30 and is used to receive and amplify the RF signal from the signal source 30; and the oscillator circuit 10 is constructed from a plurality of LC tank resonant circuits (101)(102) and electrically connected to the signal injection circuit 20. The oscillator circuit 10 is used to receive the RF signal from the signal injection circuit 20 and provide an oscillating signal with a frequency around the 50% of the frequency of the RF signal. The numbers of the plurality of LC tank resonant circuits (101)(102) determine the injection locking range of the frequency divider circuit 100.

The signal injection circuit 20 comprises a plurality of resistors (214)(215); a plurality of capacitors (212)(213); and a NMOS transistor (211), electrically connected to the plurality of resistors (214)(215) and the plurality of capacitors (212)(213), used to receive and amplify the RF signal from the signal source 30. The plurality of resistors (214)(215) and the plurality of capacitors (212)(213) are connected in series each other and used to stabilize the voltage of the signal injection circuit 20.

The oscillator circuit 10 is constructed from a plurality of LC tank resonant circuits (101)(102) and is used to receive the RF signal from the signal injection circuit 20 and provide an oscillating signal with a frequency around the 50% of the frequency of the RF signal. The plurality of LC tank resonant circuits (101)(102) has a plurality of N type metal-oxide-semiconductor field effect transistor (N-MOSFET) to generate a negative resistance effect to oscillate the oscillator circuit 10 continuously. The inductance and capacitance of the plurality of LC tank resonant circuits (101)(102) determine the injection locking range of the frequency divider circuit. The signal injection circuit 20 has at least one N type metal-oxide-semiconductor field effect transistor (N-MOSFET). The oscillator circuit 10 also has at least one N type metal-oxide-semiconductor field effect transistor (N-MOSFET) (111)(112). In addition, the oscillator circuit 10 is selected from one of the group including inter-coupled oscillator, Armstrong oscillator and colpitts oscillator.

For operating procedure, an oscillator circuit 10 receives the RF signal from the signal injection circuit 20 and provides an oscillating signal with a frequency around the 50% of the frequency of the RF signal. Thus, the disclosed injection locking frequency divider can obtain an output signal with a frequency ($f_{free}$) around the 50% of the frequency of the RF signal. If the difference between the frequency of the RF signal and the frequency of oscillating signal is too large, the disclosed injection locking frequency divider can not output an output signal with a frequency around the 50% of the frequency of the RF signal. It is noted that the locking range is calculated as:

Locking-range(%)=$[(f_{OH}-f_{OL})/(2*f_{free})]$

Where $f_{OH}$ and $f_{OL}$ are the locked highest and lowest frequencies in the circuit, respectively. For design a frequency divider, the locking range is as large as better.

Figure 2:
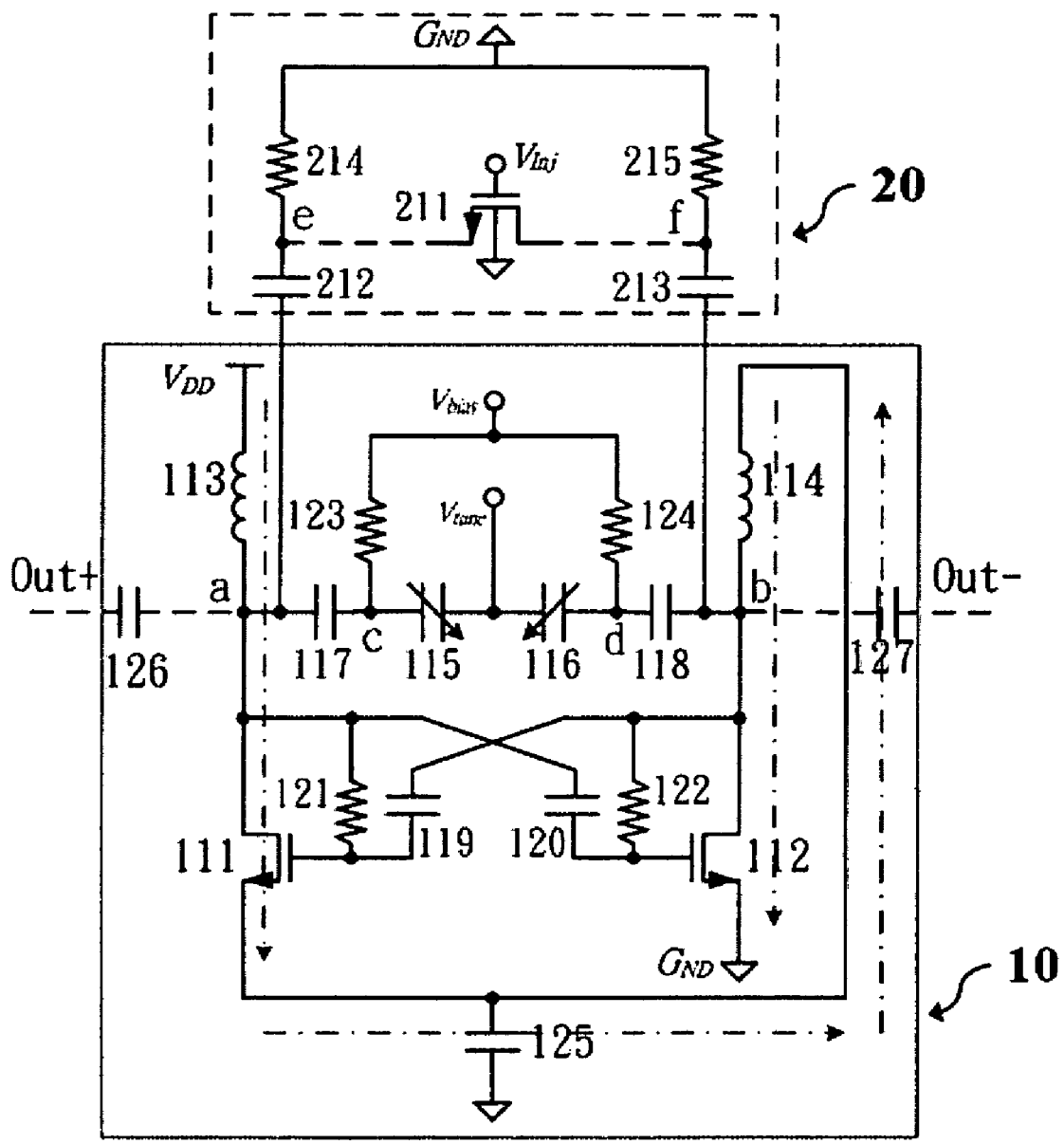
FIG. 2 shows the detail circuit of the low-power consumption frequency divider circuit according to the first embodiment of the present invention.

Referring to the FIG. 2, it shows the detail circuit of the low-power consumption frequency divider circuit according to the first embodiment of the present invention. The oscillator circuit 10 is constructed from a pair of N type metal-oxide-semiconductor field effect transistors (N-MOSFET)(111) (112), which are inter-coupled to generate a negative resistance effect to balance the parasitic impedance of the plurality of LC tank resonant circuits (101)(102). Since the (N-MOSFET)(111)(112) have the inter-coupled structure, the current path can be reduced to one, thus to reduce the power consumption of the disclosed circuit. The plurality of LC tank resonant circuits (101)(102) are constructed from the two inductors (113)(114) and two varistors (115)(116). Due to the current reused method, the voltage of point a may be not consistent with voltage of point b, and thus the biased gate voltages of the transistors (111)(112) are not the same. Therefore, the capacitors (119)(120) and the resistors (121)(122) are added in the LC tank resonant circuits. The application of the added capacitors (119)(120) is DC blocking and the applications of the added resistors (121)(122) are AC blocking and providing a new DC voltage level, thus the $V_{DS}$ and $V_{GS}$ of the transistors (111)(112) can be consistent. The inconsistent of the voltage of point c and d would cause the inconsistent bias for the varistors (115)(116). The extra added capacitors (117) (118) and resistors (123)(124) can used to improve such problem. In addition, to overcome the interference between the adjacent circuit, the filtering capacitor 125 is used to filter the undesired noise. The capacitors (126)(127) are used for DC blocking to obtain and output the same DC voltage level of differential output signal for next circuit.

The signal injection circuit 20 has is constructed from one N type metal-oxide-semiconductor field effect transistor (N-MOSFET) 211. The drain and source of the N-MOSFET 211 are connected to the point a and b, respectively. To overcome the voltage inconsistent of the point a and b, the resistors (214)(215) and the capacitors (212)(213) are added to improve the problem. The drain and source of the N-MOSFET 211 are connected between the resistor and the capacitor, namely point e and f. Since the gate of the N-MOSFET 211 is the place where the signal source 30 inputs a RF signal to, thus the drain and source of the N-MOSFET 211 would be switched by the signal amplitude of the signal source 30. As the signal amplitude of the signal source 30 is high, the point a and b turn on and the gate of the N-MOSFET 211 is short-circuited. As the signal amplitude of the signal source 30 is low, the drain and source of the N-MOSFET 211 turn off and the gate of gate of the N-MOSFET 211 is open-circuited. Therefore, as the signal source 30 outputs a signal with frequency (fo) to the gate of the N-MOSFET 211, the two ports of resonator of the oscillator circuit 10 would be short or open-circuited. If the oscillator circuit 10 receives the RF signal from the signal injection circuit 20 and provides an oscillating signal with a frequency around the 50% of the frequency of the RF signal. Thus, the disclosed injection locking frequency divider can obtain an output signal with a frequency ($f_{free}$) around the 50% of the frequency of the RF signal. In addition, the varistors (115)(116) in the plurality of LC tank resonant circuits (101)(102) are used to provide varied capacitance to increase the locking range of the disclosed frequency divider 100.

Figure 3:
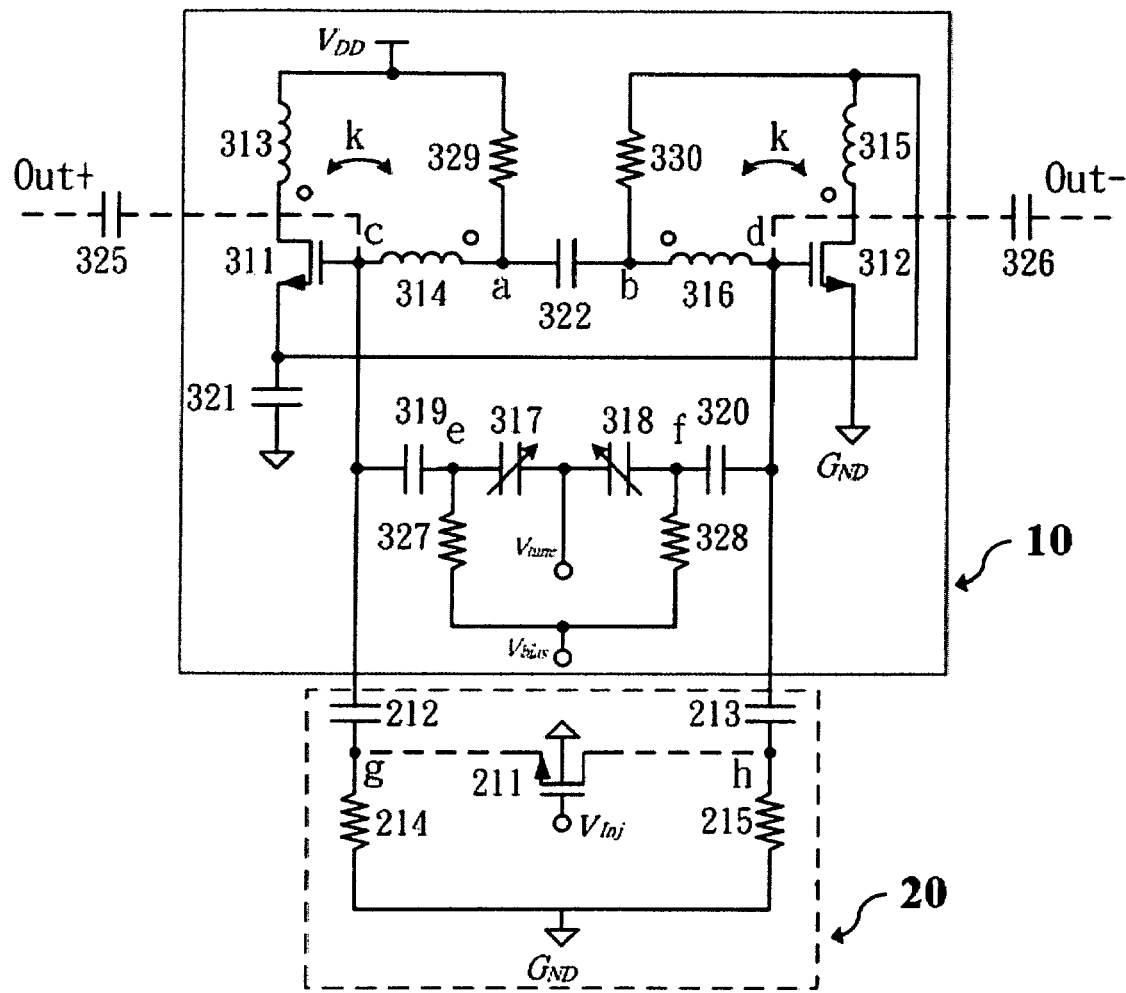
FIG. 3 shows the detail circuit of the low-power consumption frequency divider circuit according to the second embodiment of the present invention.

Referring to FIG. 3, it shows the detail circuit of the low-power consumption frequency divider circuit according to the second embodiment of the present invention. The circuit of second embodiment is similar to that of first embodiment. The most difference between them is that the oscillator circuit 10 of the second embodiment is constructed from the balanced LC tank resonant circuit 10. The balanced LC tank resonant circuit 10 is an Armstrong oscillator, mainly comprising a N-MOSFET 311, two inductors (313)(314) and a varistor 317. The varistor 317, connected to the gate (point c) of the N-MOSFET 311, and the inductor 314 form the LC tank resonant circuit 101. The N-MOSFET 311, the varistor 318 and the inductors form another LC tank resonant circuit 102. The capacitor 322 connected to both the point a and point b is used to couple the signals from the different LC tank resonant circuit (101)(102) to output a differential signal. Thus, a balanced difference oscillator is then formed and named. Due to the current reused method, the voltage of point a may be not consistent with voltage of point b, and thus the biased gate voltages of the transistors (311)(312) are not the same. Therefore, the resistors (329)(330) are added in the LC tank resonant circuits. The applications of the added resistors (329)(330) are AC blocking and providing a new DC voltage level, thus the $V_{DS}$ and $V_{GS}$ of the transistors (311)(312) can be consistent The inconsistent of the voltage of point c and d would cause the inconsistent bias for the varistors (317)(318). The extra added capacitors (319)(320) and resistors (327) (328) can used to improve such problem. In addition, to overcome the interference between the adjacent circuit, the filtering capacitor 321 is used to filter the undesired noise. The capacitors (325)(326) are used for DC blocking to obtain and output the same DC voltage level of differential output signal for next circuit.

Figure 4:
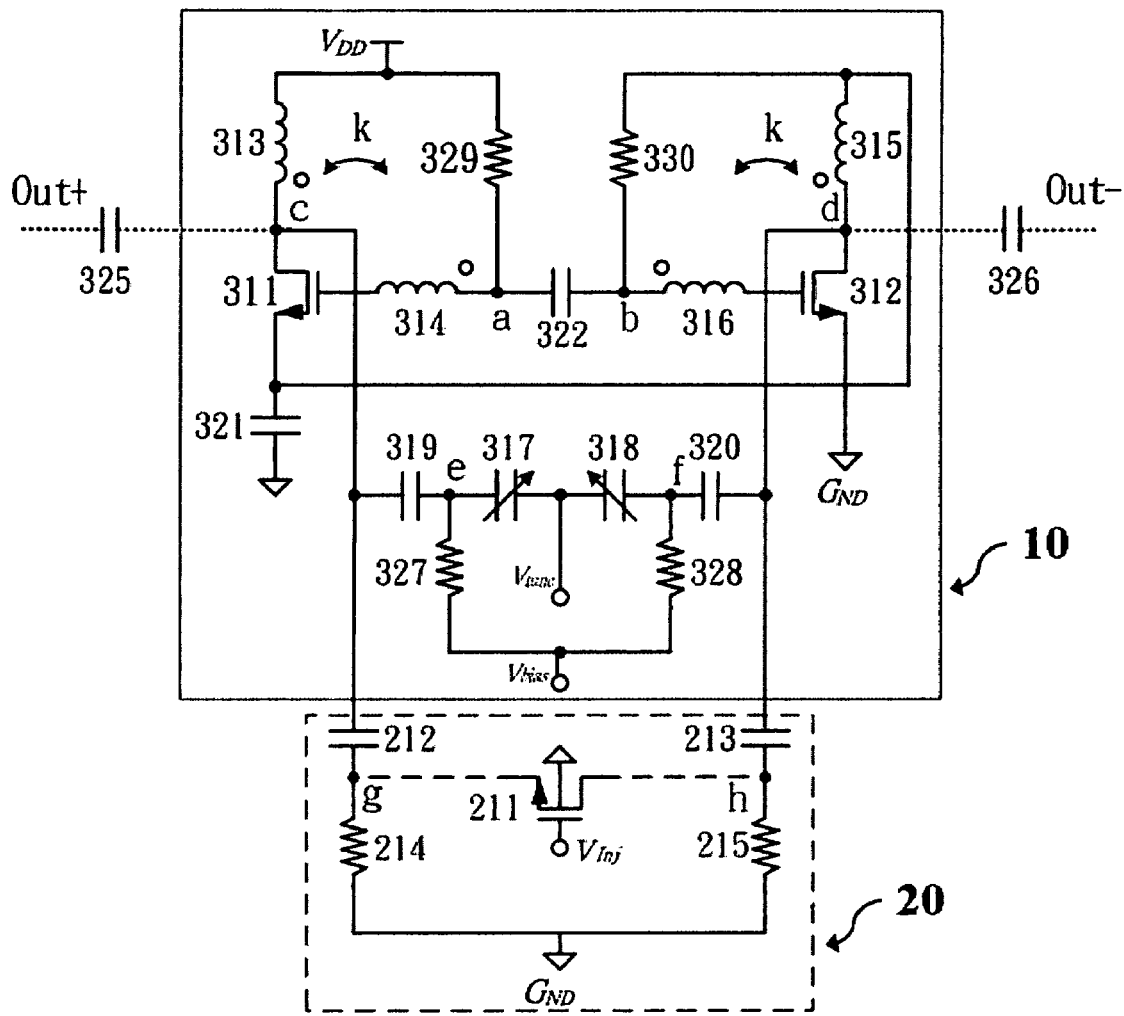
FIG. 4 shows the detail circuit of the low-power consumption frequency divider circuit according to the third embodiment of the present invention.

FIG. 4 shows the detail circuit of the low-power consumption frequency divider circuit according to the third embodiment of the present invention. The circuit of third embodiment is similar to that of second embodiment. The most difference between them is that the varistors (317)(318) are connected to the point c and d of the N-MOSFET (311)(312), respectively.

Figure 5:
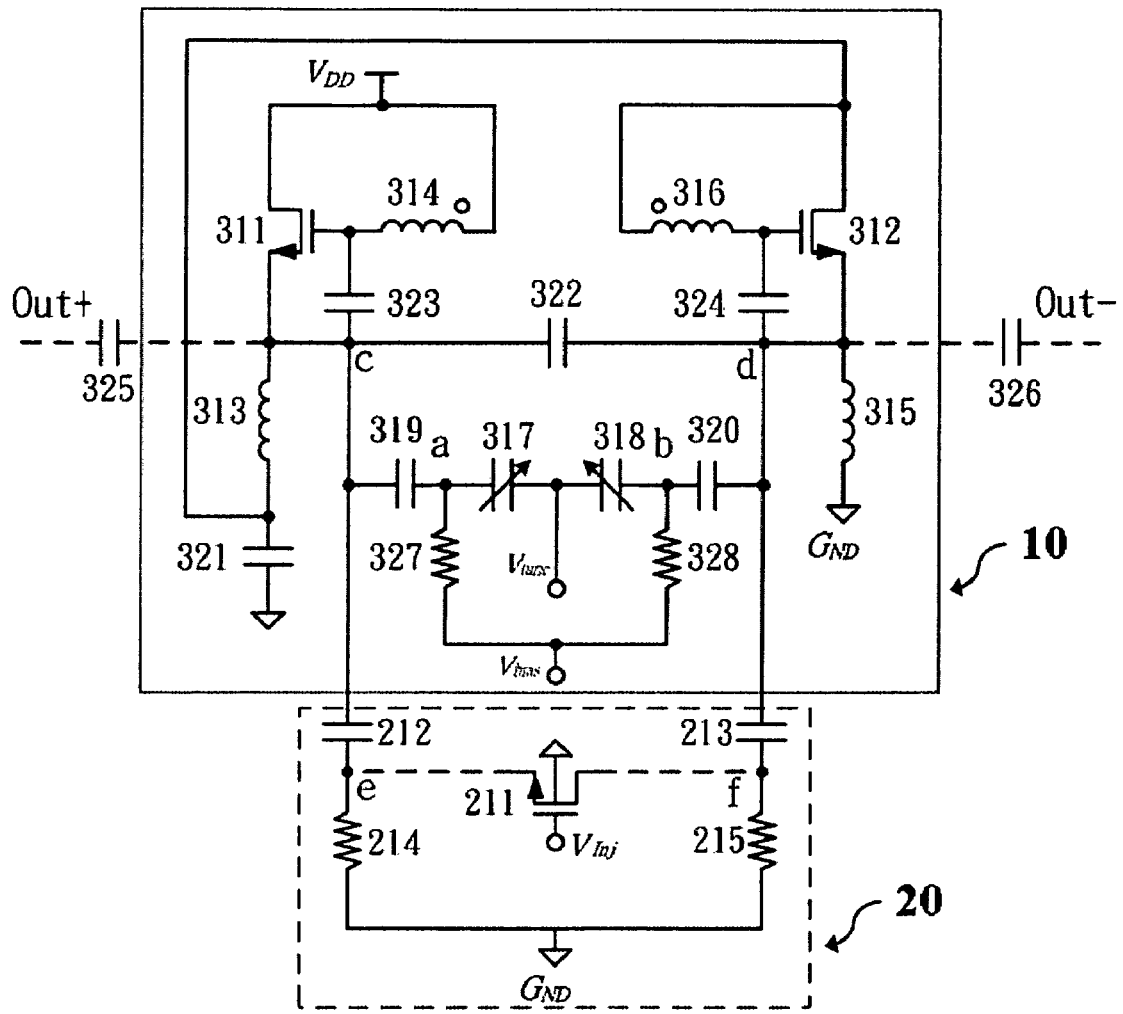
FIG. 5 shows the detail circuit of the low-power consumption frequency divider circuit according to the fourth embodiment of the present invention.

FIG. 5 shows the detail circuit of the low-power consumption frequency divider circuit according to the fourth embodiment of the present invention. The circuit of fourth embodiment is similar to that of first embodiment. The different LC tank resonant circuit (101)(102) can be used to form the oscillator circuit 10 with current reused function. The most difference between the circuit of fourth embodiment and that of first embodiment them is that the LC tank resonant circuit (101)(102) of the oscillator circuit 10 of the fourth embodiment is constructed from the Colpitts oscillator.

Figure 6:
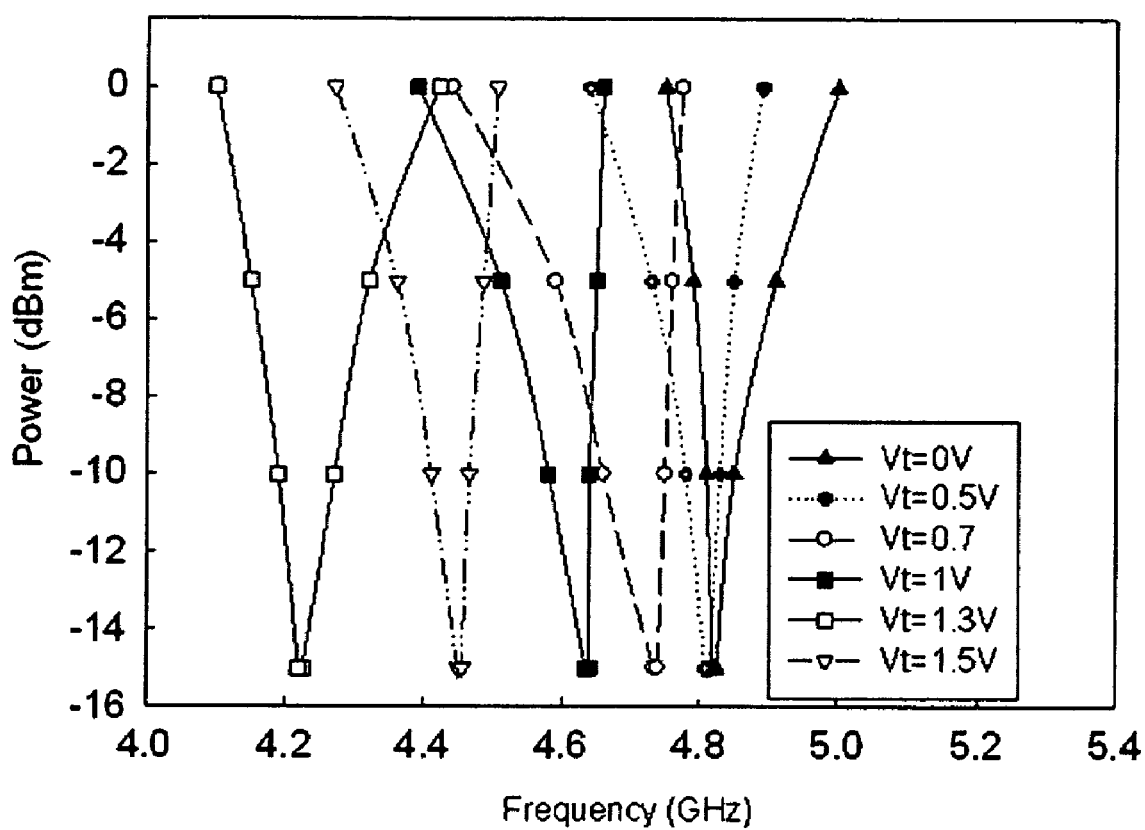
FIG. 6 shows the performance of the low-power consumption frequency divider circuit according to the first embodiment of the present invention.

FIG. 6 shows the performance of the low-power consumption frequency divider circuit according to the first embodiment of the present invention. It indicates the measured power and locking frequency. Each V-shaped curve expresses different tuned voltage. It is clear that the effective capacitance of the varistors (115)(116) would be changed as the tuned voltage changes. Thus, the working frequency or named oscillating frequency of the disclosed frequency divider 100 would be tuned.

It must be noted that since the disclosed circuit is fully integrated on the same chip. The transistor of present invention can be implemented by using Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS). Preferably, PHEMT is suitable for the gain stage and power stage in the microwave to millimeter wave range. Semiconductor materials broadly applicable to the gain stage and power stage include: silicon, silicon-on-insulator (SOI), silicon-germanium (SiGe), gallium arsenide (GaAs), indium phosphide (InP) and silicon-germanium-carbon (SiGe—C) materials.

From the above description, the low power consumption frequency divider circuit 100 according to the present invention use less current path, unlike the prior art. It uses the configuration of current reused circuit to form the common current path, and thus can reduce the power loss in the disclosed frequency divider circuit. Although the invention has been explained in relation to its preferred embodiment, it is not used to limit the invention. It is to be understood that many other possible modifications and variations can be made by those skilled in the a*t without departing from the spirit and scope of the invention as hereinafter claimed.

What is claimed is:

1. A low power consumption frequency divider circuit, comprising:
   a signal source, used to provide a RF signal;
   a signal injection circuit, electrically connected to the signal source, used to receive and amplify the RF signal from the signal source; and
   an oscillator circuit, constructed from a plurality of LC tank resonant circuits, electrically connected to the signal injection circuit, used to receive the RF signal from the signal injection circuit and provide an oscillating signal with a frequency around the 50% of the frequency of the RF signal;
   where the inductance and capacitance of the plurality of LC tank resonant circuits determine the injection locking range of the frequency divider circuit.

2. A low power consumption frequency divider circuit as claimed in claim 1, wherein the signal injection circuit comprises:
   a plurality of resistors;
   a plurality of capacitors; and
   a transistor, electrically connected to the plurality of resistors and the plurality of capacitors, used to receive and amplify the RF signal from the signal source;
   where the plurality of resistors and the plurality of capacitors are connected in series each other and used to stabilize the voltage of the signal injection circuit.

3. A low power consumption frequency divider circuit as claimed in claim 1, wherein the plurality of LC tank resonant circuits has a plurality of N type metal-oxide-semiconductor field effect transistor (N-MOSFET) to generate a negative resistance effect to oscillate the oscillator circuit continuously.

4. A low power consumption frequency divider circuit as claimed in claim 1, wherein the signal injection circuit has at least one N type metal-oxide-semiconductor field effect transistor (N-MOSFET).

5. A low power consumption frequency divider circuit as claimed in claim 1, wherein the oscillator circuit has at least one N type metal-oxide-semiconductor field effect transistor (N-MOSFET).

6. A low power consumption frequency divider circuit as claimed in claim 1, wherein the oscillator circuit is selected from one of the group including inter-coupled oscillator, Armstrong oscillator and colpitts oscillator.

* * * * *